United States Patent [19]

Eden et al.

[11] Patent Number: 4,970,413
[45] Date of Patent: Nov. 13, 1990

[54] VBB-FEEDBACK THRESHOLD COMPENSATION

[75] Inventors: Richard C. Eden, Thousand Oaks; John E. Clark, Newbury Park; Alan S. Fiedler; Frank S. Lee, both of Thousand Oaks; Robert Miller, Newbury Park, all of Calif.

[73] Assignee: Gigabit Logic, Newbury Park, Calif.

[21] Appl. No.: 113,944

[22] Filed: Oct. 28, 1987

[51] Int. Cl.$^5$ ............... H03K 17/16; H03K 19/20; H03K 3/01; G06F 7/38
[52] U.S. Cl. ................. 307/443; 307/448; 307/450; 307/468; 307/296.1; 307/296.5; 307/264; 307/296.6
[58] Field of Search ............ 307/443, 468, 475, 448, 307/446, 457, 296.1, 5, 6, 450, 451

[56] References Cited

U.S. PATENT DOCUMENTS

| | | | |
|---|---|---|---|
| 4,423,339 | 12/1983 | Seelbach et al. | 307/475 |
| 4,558,235 | 12/1985 | White et al. | 307/443 |
| 4,631,426 | 12/1986 | Nelson et al. | 307/475 |
| 4,651,333 | 3/1987 | Cappon | 307/450 |
| 4,661,726 | 4/1987 | Biard | 307/450 |
| 4,663,543 | 5/1987 | Sitch | 307/443 |
| 4,697,110 | 9/1987 | Masuda et al. | 307/448 |

FOREIGN PATENT DOCUMENTS 0019033 2/1983 Japan .................. 307/446

OTHER PUBLICATIONS

McLeod, "The First GaAs Compiler is already Producing Chips", Electronics, Apr. 30, 1987.

Primary Examiner—Stanley D. Miller
Assistant Examiner—Trong Quang Phan
Attorney, Agent, or Firm—Lyon & Lyon

[57] ABSTRACT

A $V_{BB}$ input threshold potential with feedback circuitry is used to stabilize all of the logic inputs on an GaAs IC to ECL compatible levels over a normal temperature range and normal power supply variations. The system called "$V_{BB}$-Feedback" uses "zero translation delay" direct Capacitor Diode Fet Logic (CDFL) inputs. This is an extension of the CDFL circuit approach in which the voltage across the input level shift circuitry on all inputs is adjusted to maintain a threshold voltage equal to the dc potential on an "extra" $V_{BB}$ input in spite of variations of temperature, power supply voltages or processing parameters such as MESFET pinchoff voltage. A dc potential ($V_{BB}$) is applied to the "extra" $V_{BB}$ input, which is an additional input that is essentially identical to the actual logic inputs. All of the logic input threshold voltages are then slaved to the $V_{BB}$ dc potential applied to the "extra" $V_{BB}$ input. ECL compatability is accomplished by combining a reasonably compliant, but uniform, CDFL voltage shifter with feedback circuitry to maintain the shift voltages at proper levels thereby achieving the desired input logic threshold.

8 Claims, 5 Drawing Sheets

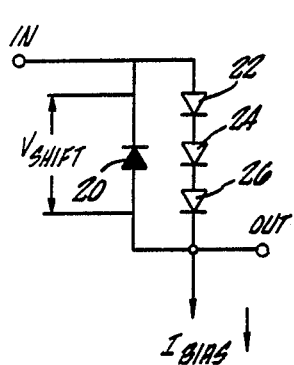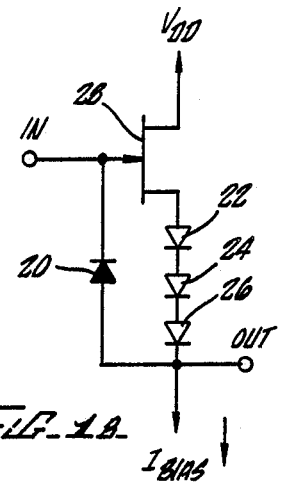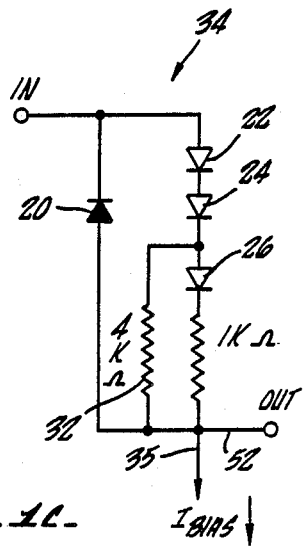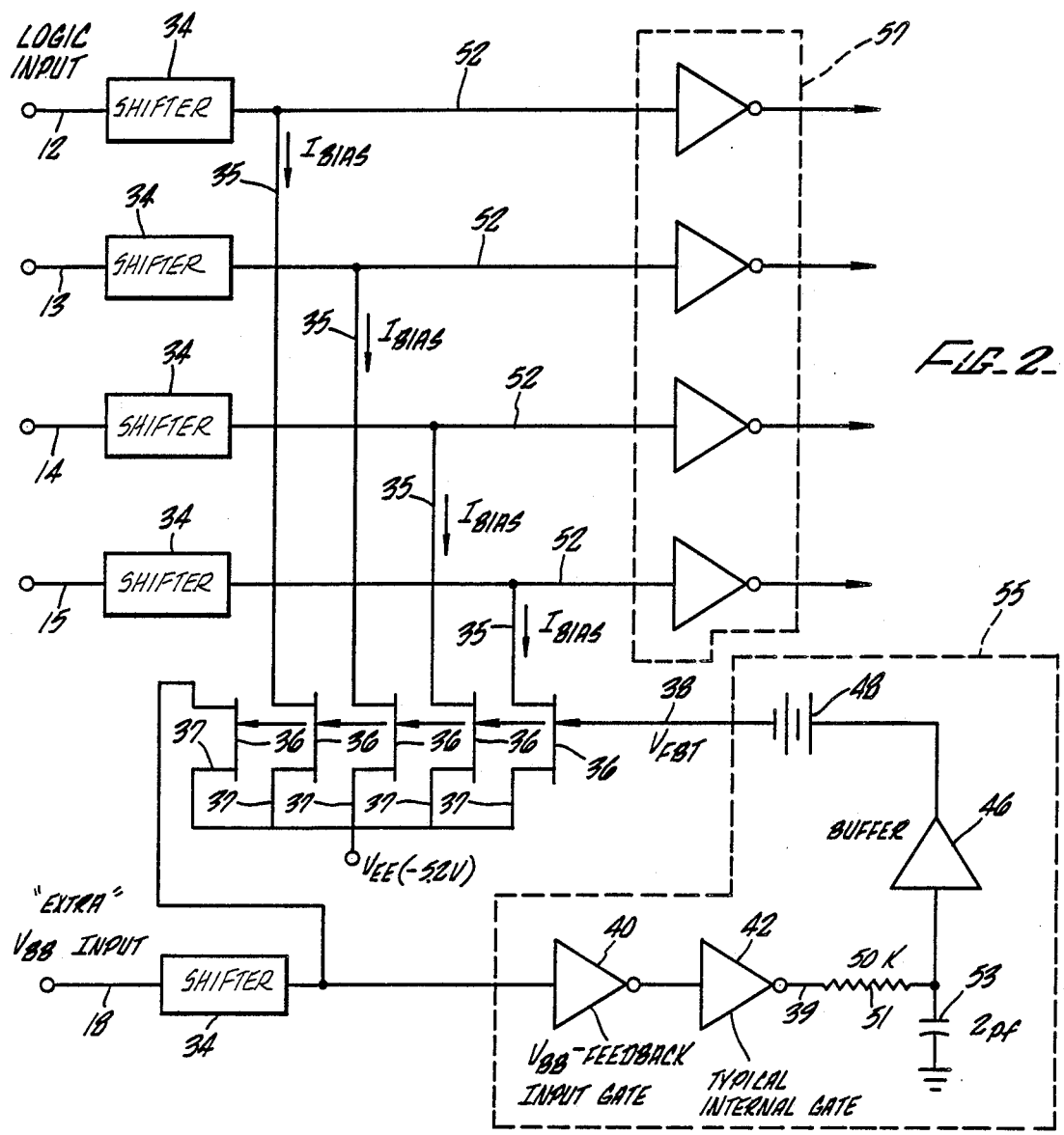

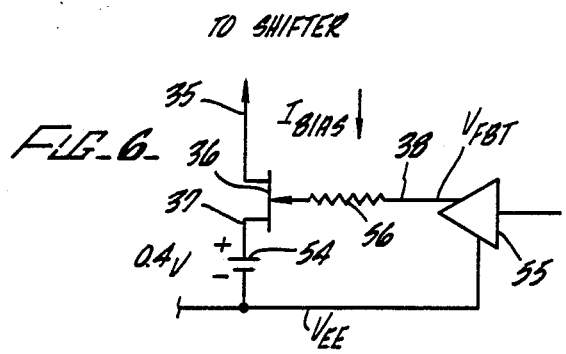
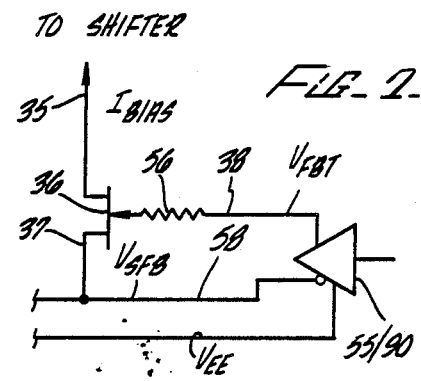
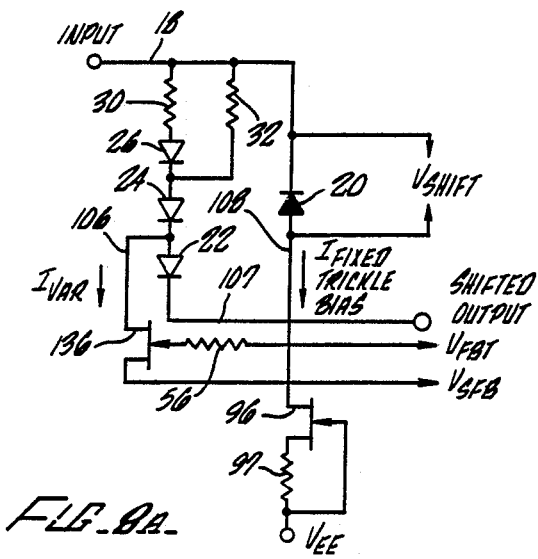
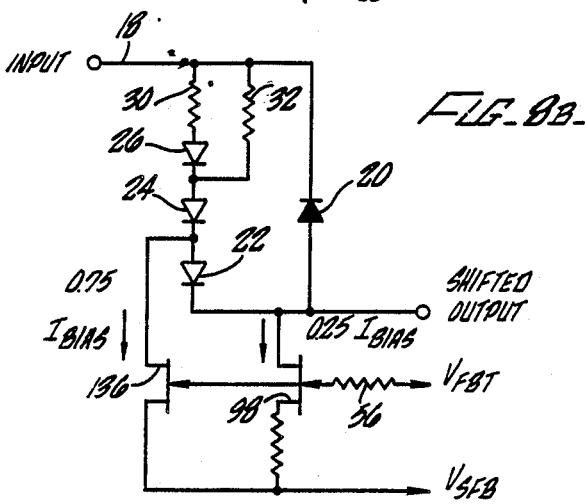
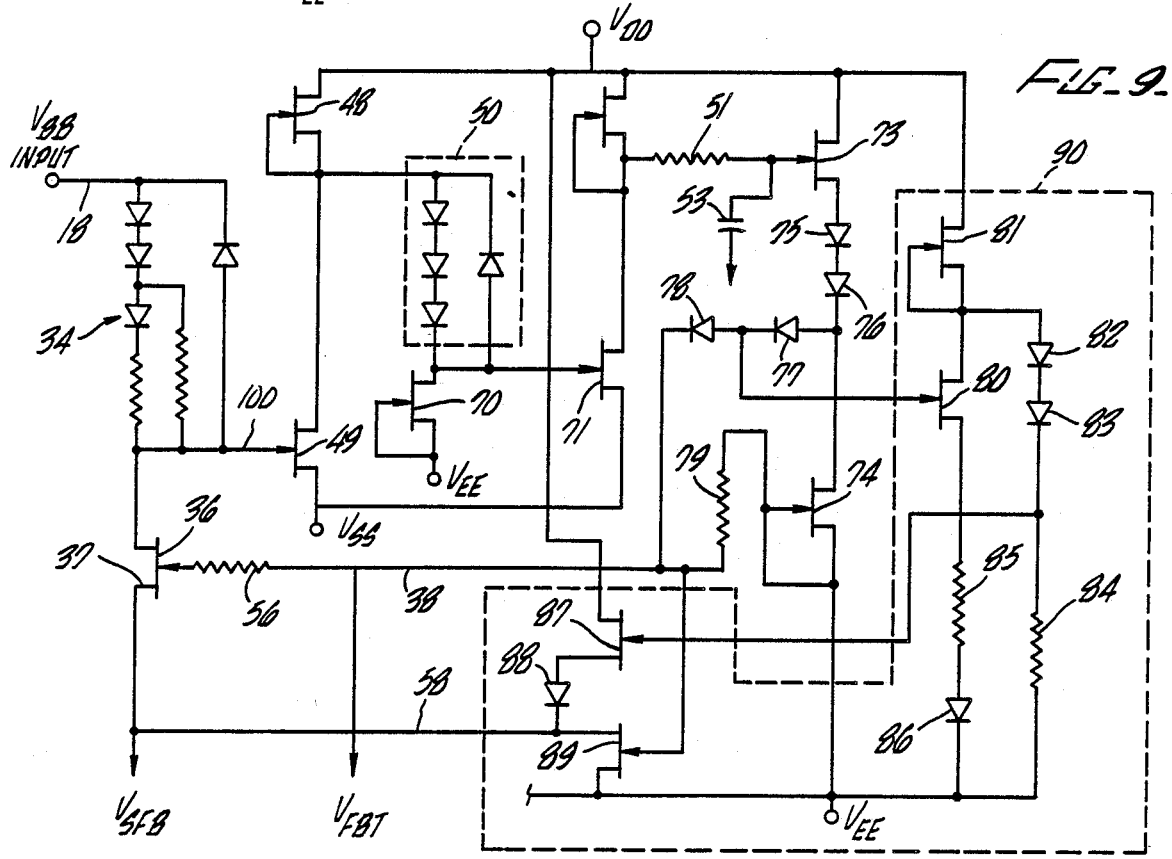

VBB-FEEDBACK THRESHOLD COMPENSATION

BACKGROUND

The extremely high switching speeds attainable with GaAs integrated circuits (IC's) make them very attractive for key portions of high speed systems. However, it is necessary that the GaAs ICs interface with the high speed silicon ICs used in the remainder of such high-speed systems. This has proven very difficult to achieve in practice because the dominant silicon IC technology for high speed applications is Emitter Coupled Logic (ECL) (typically F 100K or 10KH series made by Fairchild and Motorola, respectively) with logic swings ($\Delta V_L$) that are quite low, typically 600 mV to 800 mV. Such low logic swings make it essential to position the logic input threshold voltage, $V_{th}$, of a GaAs IC interfacing to ECL circuits precisely at the ECL threshold, or center of the ECL logic swing, which is called $V_{BB}$ in ECL terminology. Practically, if $V_{th}$ is not within of the order of 100 mV of $V_{BB}$, the noise margin for logic input signals with the same polarity as the $V_{th}-V_{BB}$ input threshold voltage error will be substantially degraded, along with dynamic response characteristics. Input threshold compatibility is very difficult to achieve in Field Effect Transistor (FET) logic because FETs do not have the extremely tight threshold voltage control of approximately 10 mV $\Delta V_{BE}$ that bipolar transistors inherently have. Further, the temperature coefficients of $V_{th}$ for GaAs MESFET logic circuits are not a good match for ECL thresholds. Even F 100K and 10KH versions of ECL do not match each other in this regard, let alone normal (uncompensated) GaAs circuits. The threshold control problem increases in such GaAs MESFET logic circuits such as Capacitor Diode FET Logic (CDFL) which use the standard ECL power supply range ($V_{DD}$(GaAs)=$V_{CC}$(ECL) =0.0 V and $V_{EE}$ (GaAs)=$V_{EE}$(ECL) = −5.2 V). In such circuits, the sources of the switching D-MESFETS are connected to a separate intermediate $V_{SS}$ potential, typically $V_{SS} \approx -3.4$ V (±0.15 V), and hence it is to this $V_{SS}$ potential that the input threshold is referenced, as opposed to $V_{CC}$ in ECL. Hence any tolerance change in the $V_{SS}$ supply potential, ($V_{DD}-V_{SS}$), results in an identical change in the logic threshold voltage ($V_{DD}-V_{th}$) relative to ECL where $V_{CC}$ ($V_{CC}$ in an ECL circuit is the equivalent of $V_{DD}$ in a GaAs circuit) is the reference. In summary, achieving ECL input level compatibility in other than differential-input GaAs logic circuits over reasonable temperature range of 0 to +85° C. or −55° C. to +125° C., or power supply tolerance of ±5% on $V_{SS}$ has not proven possible. This represents a critical problem in achieving widespread use of the GaAs IC technology in high speed electronic systems.

SUMMARY OF THE INVENTION

The present invention uses a variation of CDFL combined with feedback to achieve $V_{BB}$ to $V_{th}$ compatibility. One of the substantial advantages of the CDFL approach is that it can accomplish ECL input level transition without significant propagation delay. In that approach, the undelayed ECL input may be used directly in logic functions for a substantial savings in delay time. Using differential input translators, on the other hand, costs at least one stage of propagation delay, which is wasted unless the internal chip logic requires both the true and complement forms of the input, such as in address drivers in a Random Access Memory or in Multiplexers. For this reason, differential inputs are used only when both polarities of the input signal are required.

The present invention extends the CDFL circuit approach to one in which the shift voltages across the input level shift circuits on all inputs are adjusted in such a way as to maintain a threshold voltage equal to the dc potential on an "extra" $V_{BB}$ input, in spite of variations of temperature, power supply voltages or processing parameters such as MESFET pinchoff voltage, $V_p$. ECL compatibility is accomplished by combining a reasonably compliant, but uniform, CDFL voltage shifter with feedback circuitry to maintain the shift voltages at proper levels thereby achieving the desired input logic threshold. This technique has proven quite effective.

Accordingly, it is an object of the present invention to provide stable interface circuitry between ECL and GaAs semiconductors operating over standard commercial or Military temperature ranges and reasonable power supply fluctuations.

A further object of the present invention is to provide stable interface circuitry between ECL and GaAs semiconductors without adding significant propagation delay.

BRIEF DESCRIPTION OF THE DRAWINGS

The object and features of the present invention will become better understood after the following description taken in conjunction with the drawings in which:

FIG. 1A shows a standard 3-diode CDFL shifter; FIG. 1B shows a source-follower CDFL level shifter, and FIG. 1C shows a CDFL diode shifter modified for enhanced compliance as used in the present invention;

FIG. 2 is a block diagram of a $V_{BB}$-Feedback approach showing the $V_{BB}$-Feedback path comprising an amplifier with negative feedback used in much the same way as an operational amplifier "OP-AMP" is commonly used;

FIG. 6 shows a standard shifter pulldown with a fixed 0.4 volt bias voltage in the source;

FIG. 7 shows a push-pull shifter pulldown circuit with the 0.4 volt source replaced by a variable source bias voltage circuit;

FIGS. 8A and 8B show two versions of a Split-Pulldown CDFL shifter approach;

FIG. 9 shows a simple transistor level implementation of the push-pull driver of FIG. 7.

DETAILED DESCRIPTION OF THE PREFERRED EMBODIMENT

Figure 3:
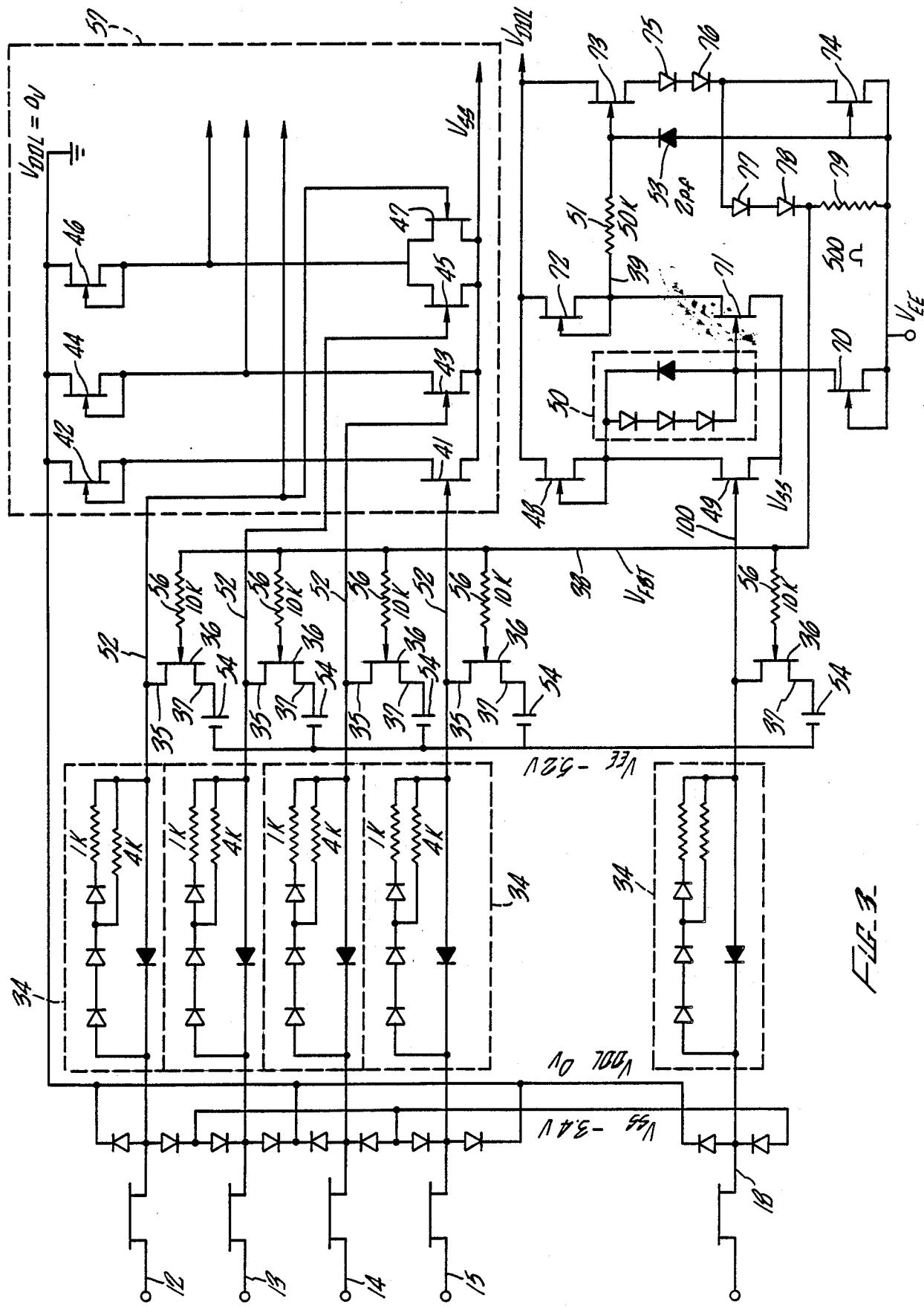
FIG. 3 is a transistor-level implementation of the $V_{BB}$-Feedback approach shown in the block diagram of FIG. 2 with some typical component values.

FIGS. 1A, 1B and 1C show three versions of the voltage shifter circuit required for CDFL logic circuits. In all three, the ac or transient logic signal currents are passed through a capacitor of some type, shown as a large-area reverse-biased Schottky diode capacitor 20 or "DCAP", which is maintained in reverse-bias by a small, approximately 10 $\mu$A to 250 $\mu$A typically, trickle current, $I_{BIAS}$. $I_{BIAS}$ is provided by some type of controllable current-sinking device connected to, or near the most negative supply, or $V_{EE}$, which is usually $-5.2$ V. The capacitance of the DCAP 20 must be many times the load capacitance to avoid ac signal voltage loss. In normal interstage CDFL shifters as shown in FIG. 1A, the reverse bias potential across DCAP 20, $V_{SHIFT}$, is regulated by a series combination of three forward-biased Schottky diodes 22, 24 and 26. For a typical input shifter the required shift ($V_{SHIFT} = V_{th} + V_{gsB}$ (voltage gate to source in Balance)$- V_{SS} = -1.3V + 0.2V + 3.4V = 2.3$ V) is obtained with a bias current of $I_{BIAS} = 250 \mu A$ thorough low $R_S$ precision-shift diodes 22, 24, and 26 which are diodes with well-controlled forward voltage drops and junction areas of approximately 2.2 $\mu m^2$. Unfortunately, while such a shifter offers outstanding reproducibility in shift potential, it is too "stiff" to achieve anywhere near enough variation in $V_{SHIFT}$ to achieve $V_{SS}$ compensation or even to compensate for the temperature dependence of the diode forward drop. A possible alternative, shown in FIG. 1B, would be to use a source-follower input to the dc path of the shifter where varying $I_{BIAS}$ would vary the gate to source voltage, $V_{gs}$, of an input D-MESFET 28 to vary $V_{SHIFT}$ ($V_{SHIFT} = V_{gs} + 3V_F$, where $V_F$ is the diode forward drop for each of the 3 diode shifters, diodes 22, 24 and 26). While this has the small advantage of providing zero input bias current it adds the voltage uncertainty of another MESFET 28 to the input threshold which is not desirable. The single-bias circuit of FIG. 1C shows a series/shunt resistor modification of the circuit of FIG. 1A which has enough compliance to give adequate $V_{SHIFT}$ range. Diode 26 is modified with enough series resistance, resistor 30, to allow, at high $I_{BIAS}$, its voltage drop to be increased well beyond the normal forward drop, or $V_F$ (which is approximately 0.75 V at room temperature). At very low bias currents a shunt resistor 32 will reduce the drop far below $V_F$. A side advantage of the implanted N+ resistors 30 and 32, is that their positive temperature coefficient helps cancel some of the negative temperature coefficient of $V_F$, even without intervention of the $V_{BB}$ feedback control of $I_{BIAS}$.

The operation of the $V_{BB}$-Feedback approach using the very uniform controlled-dc compliance shifter of FIG. 1C is illustrated in the block diagram of FIG. 2. A transistor-level implementation of the present invention is shown in FIG. 3. The key concepts in the approach are that all of the logic inputs on the GaAs IC, plus the "extra" $V_{BB}$ input, have identical shifters 34 (FIGS. 1C and 2) biased from identical pulldown FETs 36 to $V_{EE}$ which are all controlled from the same gate potential, $V_{FBT}$ (feedback trim voltage) on line 38 so that they all generate identical (controllable) shifter bias currents $I_{BIAS}$. As shown in FIG. 3, each of the source leads 37 of these pulldown FETs 36 are maintained at a potential, typically $\sim 0.4$ V, (for a $V_p = -0.8V$ in D-MESFET circuits) above $V_{EE}$ by identical resistor or resistor/diode voltage divider circuits, symbolized by batteries 54, in order to be able to reduce $I_{BIAS}$ sufficiently with a $V_{FBT}$ potential limited to $V_{FBT} \geq V_{EE}$. If the ratio between the widths of the switching FETs 41, 43, 45 and 47 and their corresponding pullup active loads 42, 44, and 46 are kept the same, and equal to the width ratio in the feedback gate consisting of switching FET 49 with its active load 48, then all of the switching FETs will have the same $V_{gs}$ at threshold, $V_{gsB}$, and hence identical input threshold voltages. Quantitatively, $V_{gsB}$ is determined by the ratio of the widths of the active load, $W_{PU}$, to that of its switching FET, $W_{FET}$, approximately by the equation $V_{gsB} \approx V_P (1 - W_{PU}/W_{FET})$. Calling the width of the active load 48, W(48), and the FET 49, W(49), if we have W(48)/W(49) = W(42)/W(41) = W(44)/W(43) = W(46)/W(45) = W(46)/W(47), then $V_{gsB}$ for all of the switching FETs will be identical. Since $V_{shift}$ for all are identical, their input threshold voltages, $V_{th}$ must all be identical. However, the magnitude of all of these "equal" threshold voltages will depend on the "equal" shifter bias currents, and hence on the feedback control voltage, $V_{FBT}$. The goal for the $V_{BB}$-Feedback approach is to insure that the input threshold voltage of all input gates is at the $V_{BB}$ potential. This means that if a dc input level of $V_{BB}$ is applied to an input gate, its output goes to a dc level equal to the threshold voltage of any gate inputs connected to that output. This is shown by the feedback path of FIG. 2 which includes $V_{BB}$-Feedback input gate 40, typical internal input gate 42, loop filter elements 51 and 53 and buffer 46. The output of the $V_{BB}$ feedback input gate 40 (comprising switching FET 49, active load 48 and normal CDFL interstage level shifter 50 shown in FIG. 3) is connected to the input of a "typical" internal input gate 42 (comprising switching FET 71 and active load 72 shown in FIG. 3) having a FET to pullup width ratio the same as generally used in internal gates on the chip. If the output of the gate 42 on line 39 is used to generate the feedback trim voltage, $V_{FBT}$, and a $V_{BB}$ dc potential is applied to the $V_{BB}$ input gate 40, the high dc gain of the "op-amp" formed by the cascaded gates 40 and 42 will force the input threshold voltage of gate 42 to equal $V_{BB}$ because of the negative feedback through $V_{FBT}$ on line 38. Because, all of the input thresholds are controlled by this same $V_{FBT}$ (FIG. 2 and FIG. 3) and are equal by design, we have achieved the goal of placing all the input logic threshold levels on the chip precisely at $V_{BB}$.

One obvious concern in this $V_{BB}$ feedback approach is that the two cascaded gates 40 and 42 used in the feedback path also have enormous ac gain and hence the potential for oscillation when operated closed loop. This is avoided by inserting a loop filter, shown in FIG. 2 as a simple single-pole low pass R-C filter, resistor 51 and capacitor 53. In FIG. 3 the loop filter is also shown as the resistor 51 and the capacitor 53 which is shown as a reverse-biased diode capacitor, connected between the gate 42 output and a source-follower buffer 46, (FIG. 2) with the loop filter having a time constant long enough to insure adequate phase margin for the feedback loop. This source-follower buffer 46, shown as FET 73 with pulldown FET 74 in FIG. 3, also contains voltage-shifting elements, corresponding to battery 48 in FIG. 2, diodes 75, 76, 77 and 78, with resistor 79 biasing the diodes 77 and 78, required to obtain $V_{FBT}$ voltages near $V_{EE}$, since the sources of the pulldown bias FETs 36 are near $V_{EE}$. In fact, the simplest approach would be to directly connect the sources of FET 36 to $V_{EE}$ as shown in FIG. 2, using a $V_{FBT}$ potential capable of going more negative than $V_{EE}$ to reduce $I_{BIAS}$ below the D-MESFET $I_{dss}$ levels (where $I_{dss}$ is the saturated drain current at $V_{gs}=0V$). However, that is generally impractical, since $V_{EE}$ is the most negative supply potential on the GaAs IC (−5.2 V). Hence in practice the source of the FETS 36 are held at a small bias potential, typically 0.4 V above $V_{EE}$, by a small resistor/diode circuit, shown as a battery 54 in FIG. 3, so that the $I_{BIAS}$ range can be adequately controlled. This $V_{EE}+0.4$ volt potential has been generated, for example, by connecting the cathode of a forward-based diode to $V_{EE}$, and which is biased with an FET whose gate and source are connected to the diode anode, and whose drain is connected to $V_{SS}$. This makes a potential of approximately $V_{EE}+0.7$ V at the diode anode, which is divided down to $V_{EE}+0.4$ V by two series resistors between the diode anode and $V_{EE}$, with the source of the FET 36 connected to the juncture of these two resistors at a $V_{EE}+0.4$ V potential. Note also in FIG. 3 that a 10K ohm isolation resistor 56 is provided between the gate of each pulldown FET 36 and the $V_{FBT}$ line 38. This is desirable to prevent large excursions of the voltage on one input from so disturbing the operating point of its pulldown FET that gate current might flow, perturbing $V_{FBT}$ and hence perturbing the threshold voltage of all the other inputs on the chip. By making the buffer 46, FIG. 2, output impedance much lower than the 10K ohm isolation resistance, this potential crosstalk problem is avoided.

The initial experimental verification of this $V_{BB}$-Feedback input threshold stabilization concept was carried out on a redesign of an original PicoLogic 10G000 quad NOR gate manufactured by Gigabit Logic. The major issues in the testing of the $V_{BB}$ feedback circuits included verifying close tracking of logic thresholds, $V_{th}$, to the $V_{BB}$ potential over the requisite $V_{BB}$ range of the ECL being used, maintenance of a constant $V_{th}$ as the $V_{SS}$ supply potential is varied and demonstration of the stability of the $V_{BB}$ feedback loop. In the experimental chips, no instabilities or oscillations in the feedback loop were observed, indicating adequate phase margins in the loop response were achieved.

Figure 4:
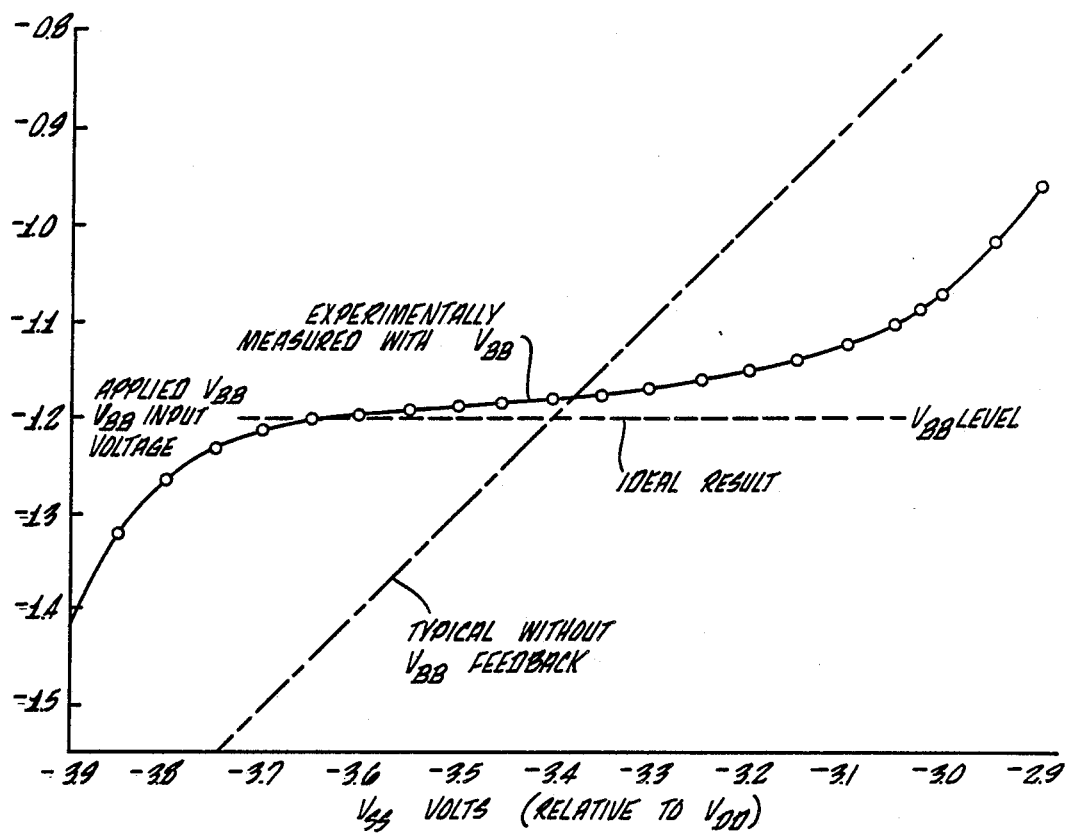
FIG. 4 shows experimentally measured values of the logic input threshold voltage, $V_{th}$, tracking the $V_{BB}$ reference input potential for a circuit of the type shown in FIG. 3.
Figure 5:
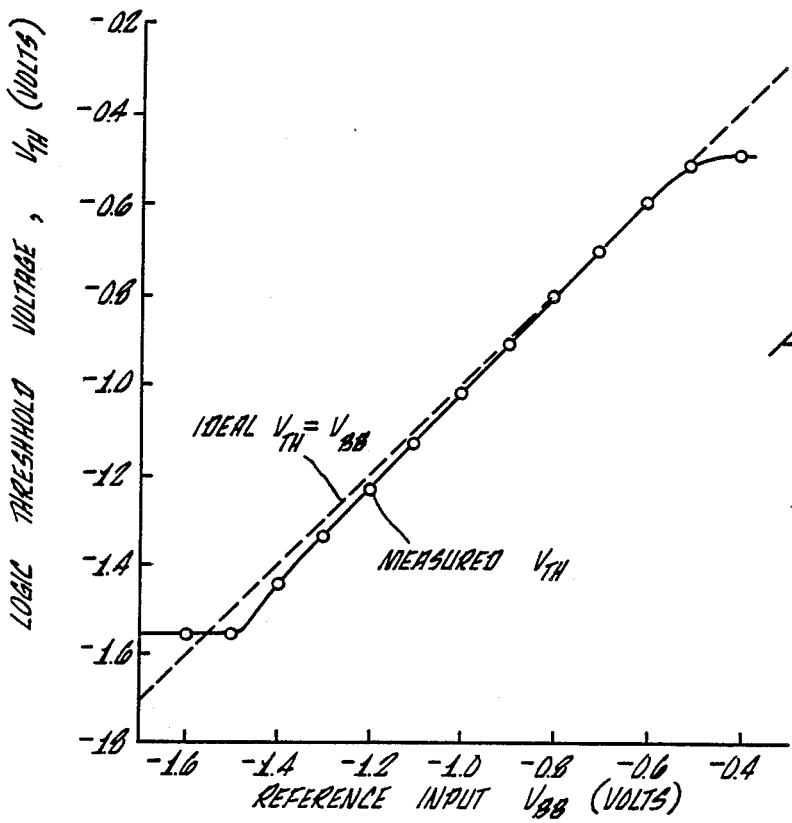
FIG. 5 shows the stability of $V_{th}$ measured for a $V_{BB}$ feedback NOR gate against changes in the $V_{SS}$ supply potential for a fixed $V_{BB}$ of −1.200 V for a circuit of the type shown in FIG. 3.

The performance results experimentally obtained with these circuits are illustrated in FIGS. 4 and 5. FIG. 4 plots data taken from a storage oscilloscope wherein a series of $V_{OUT}$ versus $V_{IN}$ (inverter) transfer curves obtained for a $V_{BB}$ feedback NOR gate (unused inputs LOW [−2.5 V]) with $V_{BB}$ input reference levels stepped from −1.500 V to −0.400 V (the nominal ECL threshold level is about $V_{BB}=−1.30$ V). FIG. 4 is a graph of the measured $V_{th}$ versus the $V_{BB}$ input reference level supplied to a GaAs IC, where $V_{th}$ is defined as the value of the logic input voltage which gives a logic output level of −1.30 V. All voltages were measured relative to $V_{DD}=0$, with $V_{SS}=−3.40$ V, $V_{EE}=−5.2$ V and the output terminated in with 50 ohms to $V_{TT}=−2.00$ V. Because of the finite gain of the feedback "op-amp" gates 40 and 42 FIG. 2, and possible shifter mismatch, the slope of the $V_{th}$ versus $V_{BB}$ curve is slightly greater than unity, 1.06, but the match between $V_{th}$ and $V_{BB}$ is excellent; few tens of millivolts over more than a volt of $V_{BB}$ range. The measured variation of $V_{th}$ with $V_{SS}$ is illustrated in FIG. 5. Again, due to the finite gain of the feedback "op-amp", gates 40 and 42, the slope ($\Delta V_{th} \cong 0.085 \Delta V_{SS}$ in the best control range) is not the ideal zero, but the change in $V_{th}$ over $V_{SS}=−3.40V \pm 5\%$ is only 37 mV$_{Peak\ to\ Peak}$ (+23 mV, −14 mV). This excellent threshold voltage control is maintained over a wide range of temperature and device parameters.

For close matching to ECL output levels over wide temperature ranges, the $V_{BB}$ potential should be obtained from the ECL part. Some ECL parts provide $V_{BB}$ threshold voltage dc outputs. Alternatively the level may be generated by the dc feedback of an ECL inverter's output connected back to its input. For interface of ECL ICs to GaAs outputs, which typically provide output swings of at least −0.8 V to −1.8 V, or commonly −0.6 to −2.0 V, such precise threshold control is not required. Hence for interface to GaAs outputs, and also for some limited temperature range ECL (particularly temperature-compensated F 100K ECL) applications, a fixed $V_{BB}$ supply potential ($V_{BBS}$), may be generated on the GaAs IC, for connection to the $V_{BB}$ input. This $V_{BBS}=−1.30V$ supply, provided on most 10G PicoLogic ICS manufactured by Gigabit Logic is generated from $V_{DDL}=0$ with a combination of 10 paralled precision forward drop diodes in series with a 35 ohm n+ implanted resistor, biased at ~10 mA by a 200 ohm n+ implanted resistor to $V_{SS}=−3.4$ V. This simple $V_{BBS}$ source gives a stable −1.30 V potential with an ~40 ohm output impedance. It has good immunity to process parameter variations, and an acceptable (<20%) variation with the $V_{SS}$ supply ($\Delta V_{BBS} < 0.2 \Delta V_{SS}$), with an acceptable temperature coefficient $\Delta V_{BBS}/\Delta T=0.5$ mV/° C. which is slightly positive and intermediate between those of the F 100K and the 10KH ECL series.

Another issue is the variation in the $V_{th}$ threshold voltage obtained between various inputs on the same chip. CDFL gates with precision diode shifters give very tight distributions (standard deviation for $V_{th}$ is approximately 33 mV) for the inputs on a given chip. With the greater compliance shifter of FIG. 1C, needed for $V_{BB}$-Feedback threshold control, the statistical variation of $V_{th}$ is degraded somewhat due to the small variations in $I_{BIAS}$ caused by statistical variations among the small pulldown FETs. For example, within one chip using $V_{BB}$-Feedback, a standard deviation of $V_{th}$ of 43 mV was obtained with a 100 mV worst-case departure of $V_{th}$ from $V_{BB}$ over 12 inputs. Over a whole 3″ wafer (excluding 3 functional but marginal die), a 51 mV standard deviation of $V_{th}$ was seen, with a 103 mV worst-case deviation of $V_{th}$ from the input $V_{BB}$ potential. These uniformity results are quite adequate for practical commercial use of this $V_{BB}$ feedback approach for achieving ECL-compatible direct CDFL inputs to GaAs ICs. Also, the addition of the $V_{BB}$ feedback circuitry for achieving ECL input compatibility does not degrade the dynamic circuit performance of the GaAs IC's with their 100 to 150 ps output rise/fall times.

An improvement in the $V_{BB}$-Feedback Circuit Approach is called "Push-Pull" $V_{BB}$-Feedback. In the "Single-ended" $V_{BB}$-Feedback Circuit previously described with reference to FIGS. 2, 3 and 6, a fixed potential 54 ($V_{SC} \cong 0.4$ V) was used between $V_{EE}$ and the source 37 of the 5 μm width input bias FETs 36. This 0.4 V makes it possible to reduce $I_{BIAS}$ substantially below $I_{dss}$ ($I_{dss} \cong 400$ μA for a $V_p=−1.0$ V, Width =5 μm FET 36), to about 0.36 $I_{dss}$ for $V_{FBT}=V_{EE}$ (the most negative supply on chip). This 0.4 V sets the lower limit to the $I_{BIAS}$ value. Unfortunately, it not only limits the $V_{SHIFT}$ range, but it also limits the lower extent of the $V_g−V_{EE}$ range, so its value may not be arbitrarily increased. For instance, without $V_{SC}$, $V_g$-$V_{SS}$ could go 0.4 V lower while maintaining the $V_{ds}$ of the bias FET 36 in the proper saturated-drain range. Also, the 0.4 V bias generator 54 takes power, typically 2 mA from $V_{SS}$ to $V_{EE}$ in the usual FET-resistor-diode implementation described previously.

In general, it is good practice when using $V_{BB}$-Feedback, for uniformity of $V_{th}$ to run a separate $V_{EE}$ line for the input shifter pulldowns 36, as variations in $V_{EE}$ due to IR drops along the $V_{EE}$ line would lead to variations of $I_{BIAS}$ for the shifter, and hence variations of $V_{th}$. In the push-pull improvement of the $V_{BB}$-Feedback approach shown in FIG. 7, this extra line 58 ($V_{SFB}$) is run specifically for the sources of the input shifter pulldowns 36. This approach is called push-pull, because this $V_{SFB}$ line 58 (FIG. 7 or FIG. 9 which is a transistor level implementation of the circuit shown in FIG. 7) is driven from the $V_{BB}$ feedback op-amp, 55/90 out of phase (reversed drive polarity) to the normal gate $V_{FBT}$ on line 38. By making $V_{FBT}=V_{EE}$ and $V_{SFB}$ more positive than $V_{EE}$, the $I_{BIAS}$ of the pulldowns 36 will be greatly reduced. If $V_{SFB}$ on line 58 is lowered to $V_{EE}$ while $V_{FBT}$ is made positive with respect to $V_{EE}$, $I_{BIAS}$ can be increased far beyond $I_{DSS}$, even with relatively modest values of $V_{FBT}$-$V_{EE}$ ($\approx 0.4$ V better than with the previous approach).

The most difficult problem with the previous approach is when $V_{SS}$ is made too positive and $I_{BIAS}$ cannot be made low enough to reduce $V_{SHIFT}$ far enough to maintain $V_{th}$ at a proper level ($V_{th}=V_{SS}+V_{gsB}+V_{SHIFT}$). With this push-pull approach shown in FIGS. 7 and 9, $V_{SFB}$ can be made arbitrarily more positive than $V_{EE}$, making $V_{gs}$ as negative as necessary to reduce $I_{BIAS}$ to any arbitrarily low level, allowing much lower $V_{SHIFT}$ values to be achieved in a suitable compliant shifter.

FIG. 9 represents one simple embodiment of the push-pull driver of FIG. 7. Persons skilled in the art could design other circuits (such as differential amplifier circuits like that of FIG. 10) which could perform this function. The circuit is identical to that of FIG. 3 up through the creation of the $V_{FBT}$ gate feedback trim voltage on line 38. Elements 34 thru 79 of FIG. 9 are connected the same as in FIG. 3. To this is added an inverter/driver stage 90 including FET 80 and its source bias elements 85 and 86, its active load pullup 81 and shifter with diodes 82 and 83 biased by the resistor 84 to $V_{EE}$. This inverter drives the $V_{SFB}$ feedback line driver comprising FETs 87 and 89 and diode 88. For power savings, the drain of FET 87 may be connected to $V_{SS}$ rather than $V_{DD}$ as shown. This improved push-pull feedback configuration has been tested and found to give excellent performance over a wider temperature range and $V_{SS}$ variation than the single-ended circuit shown in FIG. 3.

Figure 10:
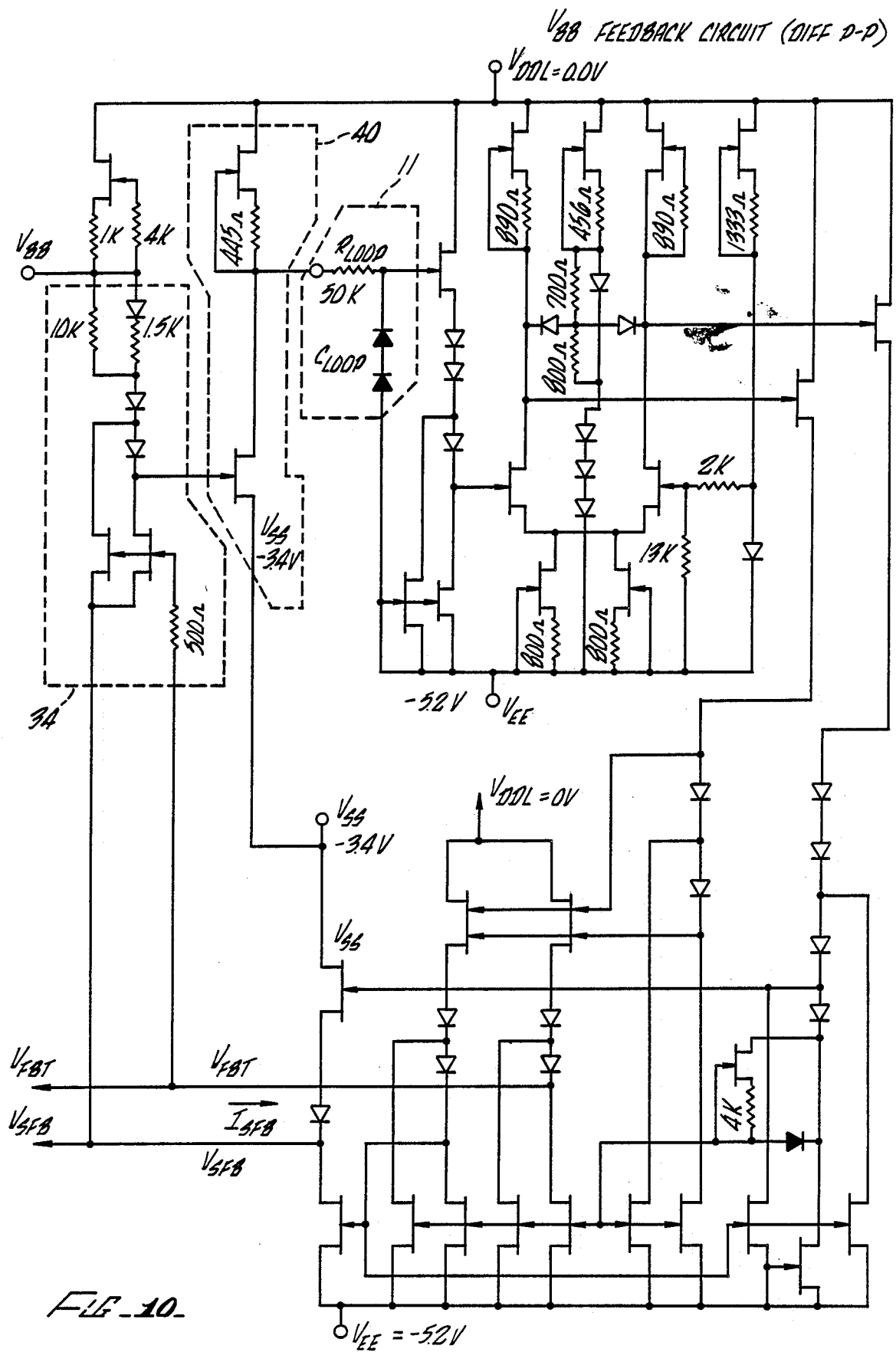
FIG. 10 shows the transistor-level drawing of a more complex differential amplifier implementation of the push-pull driver of FIG. 7 offering higher gain and wider-range performance than that shown in FIG. 9.

A further improvement in the CDFL shifter approach which can be used with either the single-ended driver of FIG. 3 or the push-pull drivers of FIGS. 9 or 10 are the Split-Pulldown shifters shown in FIGS. 8A and 8B. These CDFL voltage shifters limit the reduction of $V_{shift}$ which occurs in the shifter shown in FIG. 1C when the logic signal input voltage at line 18 in FIGS. 8A or 8B or any of the logic inputs 12 to 15 shown in FIGS. 2 or 3 is taken so low that the $V_{ds}$ of the controlled pulldown current sink FET 36 goes below the saturated drain voltage, causing a reduction its drain current, $I_{BIAS}$. The improvement is accomplished in the Split-Pulldown shifters by placing the compliant portion of the shifter, the series/parallel resistor-diode portion, resistors 30 and 32 and Diode 26, nearest the input, and running the majority of the bias current only through this portion of the shifter. This is advantageous, since the voltage at the intermediate bias node 106 (FIG. 8A) is $\approx 0.75$ V higher than that at the shifter output, so that the $V_{DS}$ of the pulldown 136 never drops below drain saturation when the input on line 18 goes low. The voltage across the small pulldown, 96 in FIG. 8A or 98 in FIG. 8B can go below saturation, disturbing this trickle bias somewhat. However, the magnitude of this trickle bias through pulldowns 96 and 98 (typically 10 uA to 50 uA) is so small in comparison to the controlled bias through pulldown 136, FIGS. 8A and 8B, (typically 20 uA to >400 uA) that the effect of the reduction in the trickle bias on line 108 on the overall shifter bias is greatly reduced (generally by a factor of 3 or more) over the simpler structure of FIG. 1C. The trickle bias may be made either fixed, FIG. 8A, at some sacrifice in $I_{BIAS}$ control range unless $I_{trickle}$ is made very small, or controlled as in FIG. 8B which is more frequently used.

FIG. 10 shows a differential amplifier implementation of the push-pull feedback circuit of FIG. 7. This implementation offers a generally wider performance range in bias voltage and temperature range as well as higher gain than the simpler circuit of FIG. 9. Block 34 in FIG. 10 corresponds to Block 34 in FIG. 2 except that Block 34 of FIG. 10 uses the split-pulldown arrangement of FIG. 8B as opposed to the "single-bias" arrangement of FIG. 1C. Block 34 in FIG. 10 also eliminates the DCAP 20 which is optional on the $V_{BB}$ input of FIGS. 2, 3, 9 or 10. Block 40 in FIG. 10 corresponds with Block 40 in FIG. 2 and Block 11 in FIG. 10 is the loop filter corresponding to the resistor 51/capacitor 53 loop filter of FIGS. 2 or 3. The remainder of the circuit of FIG. 10 corresponds to the push-pull driver/inverter 55/90 of FIG. 7.

While the preferred embodiment of the system of the present invention has been illustrated and described, certain modifications and alternatives will be apparent to those skilled in the art and the present disclosure is intended to include such modifications and alternatives within the scope of the appended claims.

What is claimed is:

1. A split-pulldown compliant voltage shifting circuit comprising
    shifter means having an input and an output, said shifter means including bias means having a resistive element and a semiconductor element, said bias means is connected in parallel to a capacitance means,
    first and second variable sinking means connected to said shifter means wherein said first variable sinking means is connected to said bias means and said second variable sinking means is connected to said bias means at a point different than said first variable sinking means, said first and second variable sinking means are for receiving a feedback trim voltage and regulating the bias currents through said shifter means.

2. A circuit as in claim 1 wherein said shifter means is a GaAs integrated circuit.

3. A compliant voltage shifting circuit comprising
    shifter means having an input and an output and a capacitance means connected between said input and said output, said shifter means including bias means having a first resistive element connected to the input of said shifter means, said first resistive element is connected in parallel with a series combination of a first voltage drop element and a second resistive element, said first voltage drop element is connected in series with a second voltage drop element, said second voltage drop element being connected in series with a first variable sinking means, said first variable sinking means being connected in parallel with a third voltage drop element and a second variable sinking means, said third voltage drop element and said second variable sinking means being connected to said output of said shifter means, and said first and second variable sinking means are for receiving a feedback trim voltage for controlling bias current through portions of said bias means.

4. A feedback driven voltage shifting circuit comprising first shifter means including first bias means having semiconductor and resistive elements connected in parallel to a capacitance means, the parallel combination of said first bias means and said capacitance means is connected to a first variable sinking means for providing a variable voltage shift across said capacitance means, and second shifter means including second bias means having semiconductor and resistive elements, said second shifter means having a second variable sinking means, said second shifter means for receiving a voltage potential, said second shifter means connected to a feedback means, said feedback means for supplying a feedback signal to said first and second variable sinking means for causing the voltage drop across said capacitance means to vary in response to said voltage potential applied to said second shifter means.

5. A feedback driven push-pull compliant voltage shifting circuit comprising first shifter means having an input and an output, said first shifter means including a first bias means having resistive and semiconductor elements, said bias means is connected in parallel to a capacitance means, first and second variable sinking means connected to said first shifter means wherein said first variable sinking means is connected to said first bias means and said second variable sinking means is connected to said first bias means at a point different than said first variable sinking means, said first and second variable sinking means are for receiving a feedback trim voltage and a variable source voltage, and second shifter means including second bias means having semiconductor and resistive elements, said second shifter means connected to a third and fourth variable sinking means, said second shifter means for receiving a voltage potential, said second shifter means connected to a feedback means, said feedback means for supplying said feedback trim voltage and said variable source voltage to said first, second, third and fourth variable sinking means for regulating bias currents through said first and second shifter means.

6. A push-pull split-pulldown compliant voltage shifting circuit comprising first shifter means having an input and an output, said first shifter means including a first bias means having resistive and semiconductor elements, said first bias means is connected in parallel to a capacitance means, first and second sinking means, said first sinking means is variable and is connected to said first bias means for receiving a feedback trim voltage and a variable source voltage, said second sinking means is connected to said first bias means at a point different than said first sinking means for providing a fixed trickle bias through said first bias means, and second shifter means including second bias means having semiconductor and resistive elements, said second shifter means connected to a third and fourth sinking means, said second shifter means for receiving a voltage potential, said second shifter means connected to a feedback means, said feedback means for supplying said variable source voltage and said feedback trim voltage to said first and third sinking means for causing the voltage drop across said capacitance means to vary in response to said voltage potential applied to said second shifter means, said fourth sinking means is connected to said second bias means at a point different than said third sinking means for providing a fixed trickle bias through said second bias means.

7. A push-pull feedback driven compliant voltage shifting circuit comprising first shifter means including a first bias means having semiconductor and resistive elements which are connected in parallel to a capacitance means, the parallel combination of said first bias means and said capacitance means are connected to a first variable sinking means, said first variable sinking means for receiving a feedback trim voltage and a variable source voltage, and second shifter means including second bias means having semiconductor and resistive elements, said second shifter means having a second variable sinking means, said second shifter means for receiving a voltage potential, said second shifter means connected to a feedback means, said feedback means for supplying said variable source voltage and said feedback trim voltage to said first and second variable sinking means for causing the voltage drop across said capacitance means to vary in response to said voltage potential applied to said second shifter means.

8. A feedback driven voltage shifting circuit comprising first shifter means including first bias means having semiconductor and resistive elements connected in parallel to a capacitance means, the parallel combination of said first bias means and said capacitance means is connected to a first variable sinking means for providing a variable voltage shift across said capacitance means, and second shifter means including second bias means having semiconductor and resistive elements, said second shifter means having a second variable sinking means, said second shifter means for receiving a voltage potential, said second shifter means connected to a feedback means, said feedback means for supplying a feedback signal to said first and second variable sinking means for causing the voltage drop across said capacitance means to vary in response to said voltage potential applied to said second shifter means, and said voltage potential is a $V_{BB}$ signal from an ECL circuit.

* * * * *